United States Patent
Goto et al.

(10) Patent No.: US 10,727,756 B2
(45) Date of Patent: Jul. 28, 2020

(54) CIRCUIT MODULE HAVING LESS NOISE AND INVERTER DEVICE USING SAME

(71) Applicant: Panasonic Intellectual Property Management Co., Ltd., Osaka (JP)

(72) Inventors: Shusaku Goto, Kyoto (JP); Yusuke Iwamatsu, Osaka (JP); Akira Yoshitake, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/548,109

(22) PCT Filed: Feb. 3, 2016

(86) PCT No.: PCT/IB2016/000078
§ 371 (c)(1),
(2) Date: Aug. 2, 2017

(87) PCT Pub. No.: WO2016/128817
PCT Pub. Date: Aug. 18, 2016

(65) Prior Publication Data
US 2018/0019682 A1    Jan. 18, 2018

(30) Foreign Application Priority Data

Feb. 10, 2015 (JP) ................. 2015-024424

(51) Int. Cl.
*H02M 7/00* (2006.01)
*H01L 25/18* (2006.01)
(Continued)

(52) U.S. Cl.
CPC ............ *H02M 7/003* (2013.01); *H01L 25/07* (2013.01); *H01L 25/18* (2013.01); *H02M 7/48* (2013.01); *H02M 7/5387* (2013.01)

(58) Field of Classification Search
CPC ...... H02M 7/003; H02M 7/5387; H01L 25/18; H01L 25/07
See application file for complete search history.

(56) References Cited

U.S. PATENT DOCUMENTS 6,064,578 A * 5/2000 Hashimoto ........... H02M 7/003
363/16
2006/0290689 A1   12/2006 Grant et al.
(Continued)

FOREIGN PATENT DOCUMENTS

EP         3029821        6/2016
JP      2009-005512       1/2009
(Continued)

OTHER PUBLICATIONS

Extended European Search Report dated Jan. 23, 2018 issued in corresponding European Patent Application No. 16748778.4.
(Continued)

*Primary Examiner* — Gustavo A Rosario-Benitez
*Assistant Examiner* — Jye-June Lee
(74) *Attorney, Agent, or Firm* — Renner, Otto, Boisselle & Sklar, LLP (57) ABSTRACT

Provided is a circuit module having less noise, and an inverter using the same. The circuit module 2 is provided with a circuit part 4, an input terminal part 5, an output terminal part 6, and a support 21. The circuit part 4 includes a conversion circuit, and a switch circuit. The output terminal part 6 includes a first output terminal 61 and a second output terminal 62 that are respectively electrically connected to a pair of output points of the circuit part 4. The arrangement of the output terminal part 6 on one surface of the support 21 is such that the first output terminal and the second output terminal are positioned around the circuit part 4 on the same side with respect to the circuit part 4, or the (Continued)

first output terminal and the second output terminal are adjacent to one another around the circuit part 4.

7 Claims, 8 Drawing Sheets

(51) Int. Cl.
    *H01L 25/07*     (2006.01)
    *H02M 7/48*     (2007.01)
    *H02M 7/5387*     (2007.01)

(56) References Cited

U.S. PATENT DOCUMENTS

| | | | |
|---|---|---|---|
| 2009/0002956 A1* | 1/2009 | Suwa | B60L 1/003 361/728 |
| 2013/0248883 A1 | 9/2013 | Das et al. | |
| 2016/0094150 A1 | 3/2016 | Domurat-Linde et al. | |

FOREIGN PATENT DOCUMENTS

| | | | | |
|---|---|---|---|---|
| JP | 2009-089541 | 4/2009 | | |
| JP | 2011-135671 | 7/2011 | | |
| JP | WO2015015721 A | * 10/2014 | ......... | H02M 7/5387 |
| WO | 2014/184030 | 11/2014 | | |
| WO | 2015/015721 | 2/2015 | | |

OTHER PUBLICATIONS

Australian Office Action dated Feb. 9, 2018 issued in corresponding Australian Patent Application No. 2016217603.
European Office Action dated Feb. 6, 2020 issued in corresponding European patent application No. 16 748 778.4.
International Search Report dated May 17, 2016.

* cited by examiner

CIRCUIT MODULE HAVING LESS NOISE AND INVERTER DEVICE USING SAME

TECHNICAL FIELD

The present invention relates generally to a circuit module and an inverter device using same, and more particularly, to a circuit module provided with a full bridge type conversion circuit and an inverter device using same.

BACKGROUND ART

Conventionally, there is known an inverter device (power conversion device) for converting a. DC voltage into an AC voltage by a full bridge inverter (conversion circuit) and for outputting the AC voltage to a power supply system. The inverter device is disclosed in, for example, Patent Document 1 (Japanese Patent Application Publication No. 2009-089541). Patent Document 1 describes a configuration including a conversion circuit, a pair of reactors, and a power supply line short circuit (switch circuit).

The conversion circuit converts an output voltage of a DC power supply circuit into a single-phase AC voltage and outputs the AC voltage. The pair of reactors is provided in each of a pair of power supply lines between the power supply system and the conversion circuit. The switch circuit operates when the output current of the converse on circuit is lowered during a period in which a drive pulse signal supplied to the conversion circuit is off, thereby short-circuiting the pair of power supply lines.

Meanwhile, it is conceivable that the conversion circuit and the switch circuit as in the conventional example described above are incorporated into an existing circuit module for a three-phase inverter. However, when the conversion circuit and the switch circuit as in the above-described conventional example are incorporated into the existing circuit module for a three-phase inverter, there is a possibility that a noise may increase.

SUMMARY OF THE INVENTION

In view of the above points, it is an object of the present invention to provide a circuit module capable of reducing a noise and as inverter device using same.

In accordance with an aspect, there is provided a circuit module including: a circuit part; art input terminal part electrically connected to a pair of input points of the circuit part; an output terminal part electrically connected to a pair of output points of the circuit part; and a support body configured, to support the circuit part, the input terminal part and the output terminal part. The circuit part includes a conversion circuit for converting a DC voltage inputted between the input points into an AC voltage and outputting the AC voltage to between, the output points, and a switch circuit electrically connected between the output points. The output terminal part includes a first output terminal and a second output terminal which are electrically connected to the respective output points. On one surface of the support body, the output terminal part is arranged in at least one of an arrangement in which the first output terminal and the second output terminal are positioned on the same side with respect to the circuit part around the circuit part and an arrangement in which the first output terminal and the second output terminal are adjacent to each other around the circuit part.

In accordance with another aspect, there is provided an inverter device including: the circuit module described above, and a substrate on which the circuit module is mounted.

According to the present invention, it is possible to reduce a noise.

DETAILED DESCRIPTION OF THE EMBODIMENTS

Figure 1A:
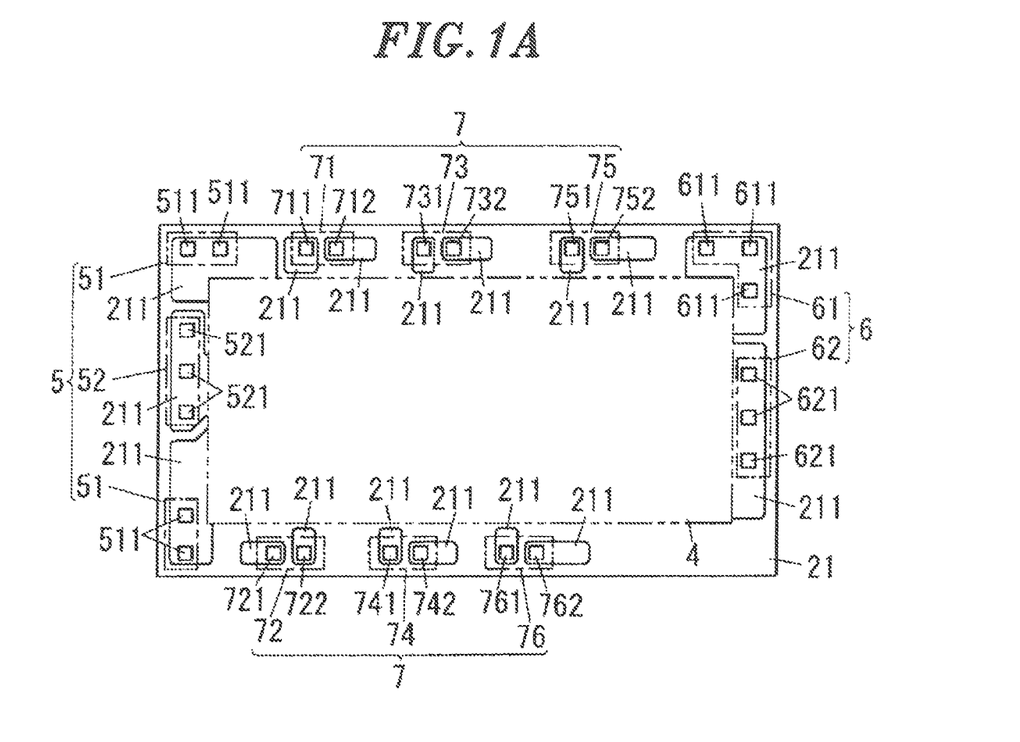
FIG. 1A is a schematic front view showing a circuit module according to an embodiment, in which a package is omitted.
Figure 1B:
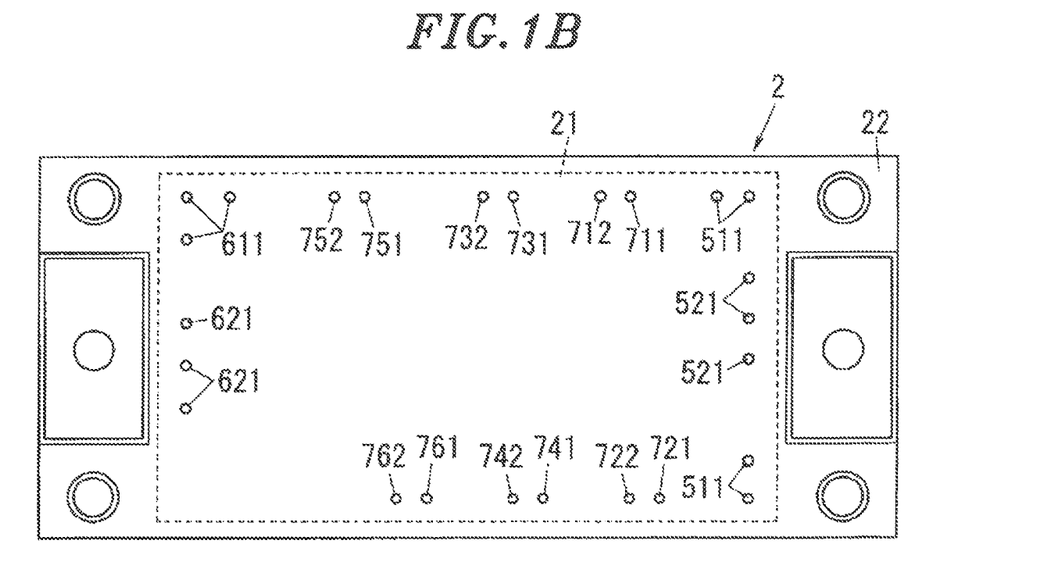
FIG. 1B is a schematic rear view showing the circuit module according to the embodiment.

Hereinafter, a circuit module 2 according to an embodiment of the present invention will be described with reference to FIGS. 1A to 3. As shown in FIGS. 1A and 1B, the circuit module 2 according to the present embodiment includes a circuit part 4, an input terminal part 5, an output terminal part 6, a drive terminal part 7, and a support body 21. As shown in FIG. 3, the circuit, part 4 includes a conversion circuit 41 and a switch circuit 42. The conversion circuit 41 converts a DC voltage inputted to a pair of input points T11 and T12 into an AC voltage. The switch circuit 42 is provided between the conversion circuit 41 and a pair of output points T21 and T22. The support body 21 supports the circuit part 4, the input terminal part 5 and the output terminal part 6.

The input terminal part 5 is electrically connected to a pair of input points T11 and T12 of the circuit part 4. The output terminal part 6 is electrically connected to a pair of output points T21 and T22 of the circuit part 4. The output terminal part 6 includes a first output terminal 61 and a second output terminal 62 which are electrically connected to the pair of output points T21 and T22, respectively. As shown in FIG. 1A, the arrangement of the output terminal part 6 on one surface of the support body 21 is at least one of the following two arrangements. That is, the arrangement of the output terminal part 6 is at least one of an arrangement in which the first output terminal 61 and the second output terminal 62 are positioned on the same side with respect to the circuit part 4 around the circuit part 4 and an arrangement in which the first output terminal 61 and the second output terminal 62 are adjacent to each other around the circuit part 4.

In this regard, the same side with respect to the circuit part 4 refers to, for example, one of one opposite sides with respect to a reference line when the circuit part 4 is bisected by the reference line. In the example shown in FIG. 1A, the first output terminal 61 and the second output terminal 62 are arranged on the right side in FIG. 1A with respect to the circuit part 4.

Figure 4:
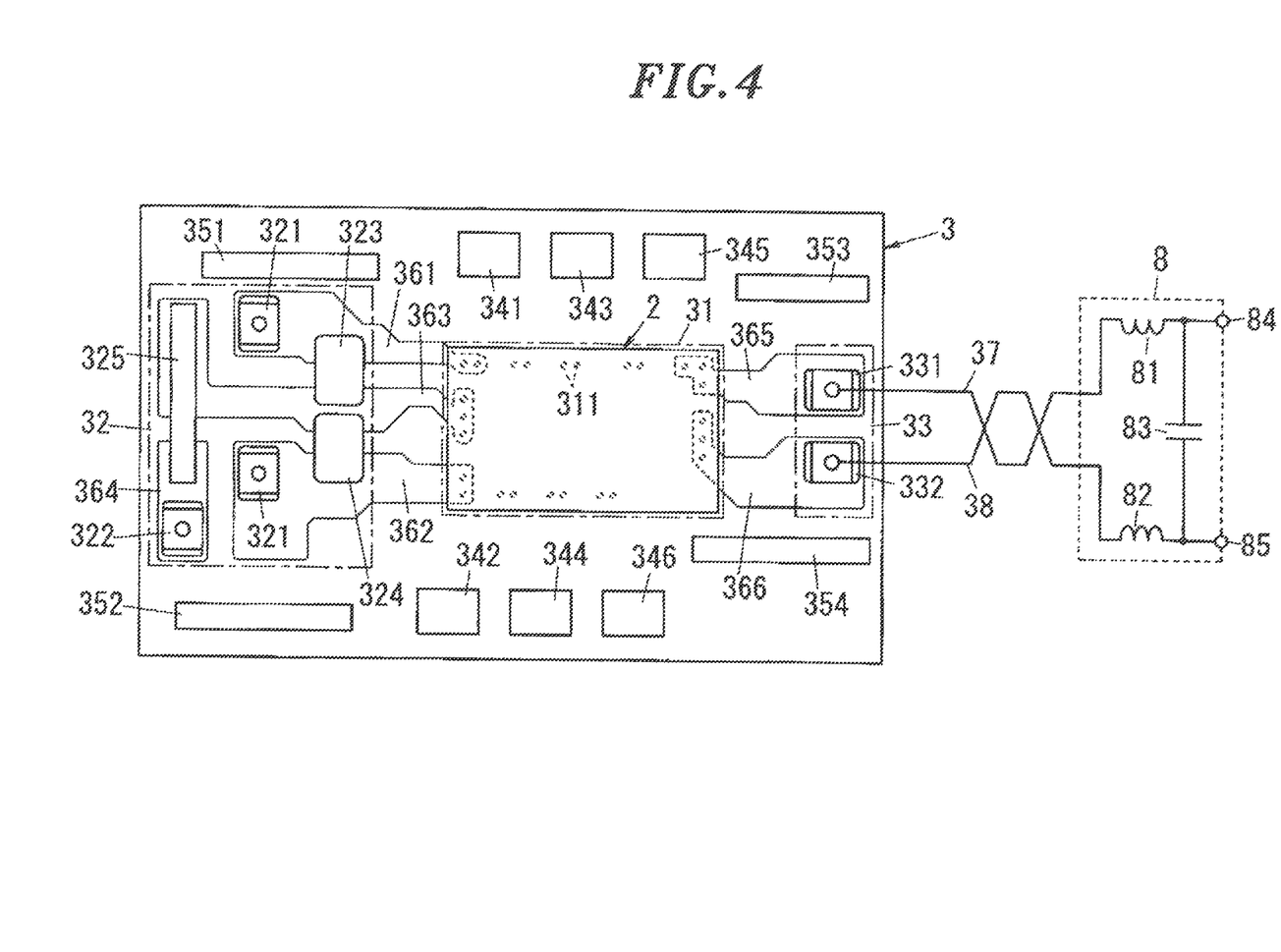
FIG. 4 is a schematic front view showing a substrate on which the circuit module of the inverter device according to the embodiment is mounted, and a filter.

In addition, as shown in FIG. 4, the inverter device 1 according to the embodiment of the present invention includes a circuit module 2 and a substrate 3 on which the circuit module 2 is mounted.

Hereinafter, the circuit module 2 and the inverter device 1 according to the present embodiment will be described in detail. However, the configuration described below is nothing more than an example of the present invention. The present invention is not limited to the following embodiment. In addition to this embodiment, various modifications may be made depending on the design or the like without departing from the technical idea of the present invention.

Further, it is assumed that the inverter device 1 of the present embodiment is used for a power conditioner for a residential house electrically connected to a photovoltaic power generation device as a DC power supply 200 (see FIG. 3). However, this is not intended to limit the application of the inverter device 1. For example the inverter device 1 of the present embodiment may be used for a power conditioner electrically connected to a DC power supply 200 other than a photovoltaic power generation device, such as a domestic fuel cell, a power storage device or the like. Moreover, the inverter device 1 of the present embodiment may be used for a non-residential power conditioner in a shop, a factory, an office or the like. Furthermore, the inverter device 1 of the present embodiment may be used for an application other than the power conditioner.

In the following description, the upper, lower, left and right sides in FIG. 1A will be referred to as upper, lower, left and right sides. In other words, the longitudinal direction of the rectangular support body 21 will be defined as a left-right direction, the side of the input terminal part 5 as viewed from the circuit part 4 will be defined as a left side, and the side of the output terminal part 6 as viewed from, the circuit part 4 will be defined as a right side. Furthermore, the transverse direction of the support body 21 will be defined as an up-down direction, the side of the first output terminal 61 as viewed from the second output terminal 62 will be defined as an tipper side, and the side of the second output terminal 62 as viewed from the first output terminal 61 will be defined as a lower side. Moreover, in the following description, the thickness direction of the support body 21 will be defined as a front-rear direction, the side of the circuit part 4 as viewed from the support body 21 will be defined as a front side, and the opposite side of the support body 21 from the circuit part 4 will be defined as a rear side. It should be noted that the above definitions of directions are not intended to limit the mode of use of the circuit module 2 and the inverter device 1 of the present embodiment.

<Configuration of Circuit Modules>

First, the circuit module 2 of the present embodiment will be described. As shown in FIGS. 1A and 1B, the circuit module 2 of the present embodiment includes a support body 21 and a package 22.

The support body 21 is, for example, a substrate and is formed in a rectangular shape elongated in the left right direction as shown in FIG. 1A. The shape of the support body 21 is not limited to the rectangular shape. The support body 21 may be formed, for example, in a circular shape, a trapezoidal shape, a triangular shape, or the like. In addition to the substrate, the support body 21 may be, for example, a lead frame or an MID (Molded Interconnect Device).

On one surface (front surface) of the support body 21, the circuit part 4, the input terminal part 5, the output terminal part 6 and a drive terminal part 7 are mounted. That is, the support body 21 supports the circuit, part 4, the input terminal part 5, the output terminal part 6 and the drive terminal part 7. Furthermore, conductors 211 for electrically connecting each of the input terminal part 5, the output terminal part 6 and the drive terminal part 7 to the circuit part 4 are formed on the front surface of the support body 21.

Figure 2:
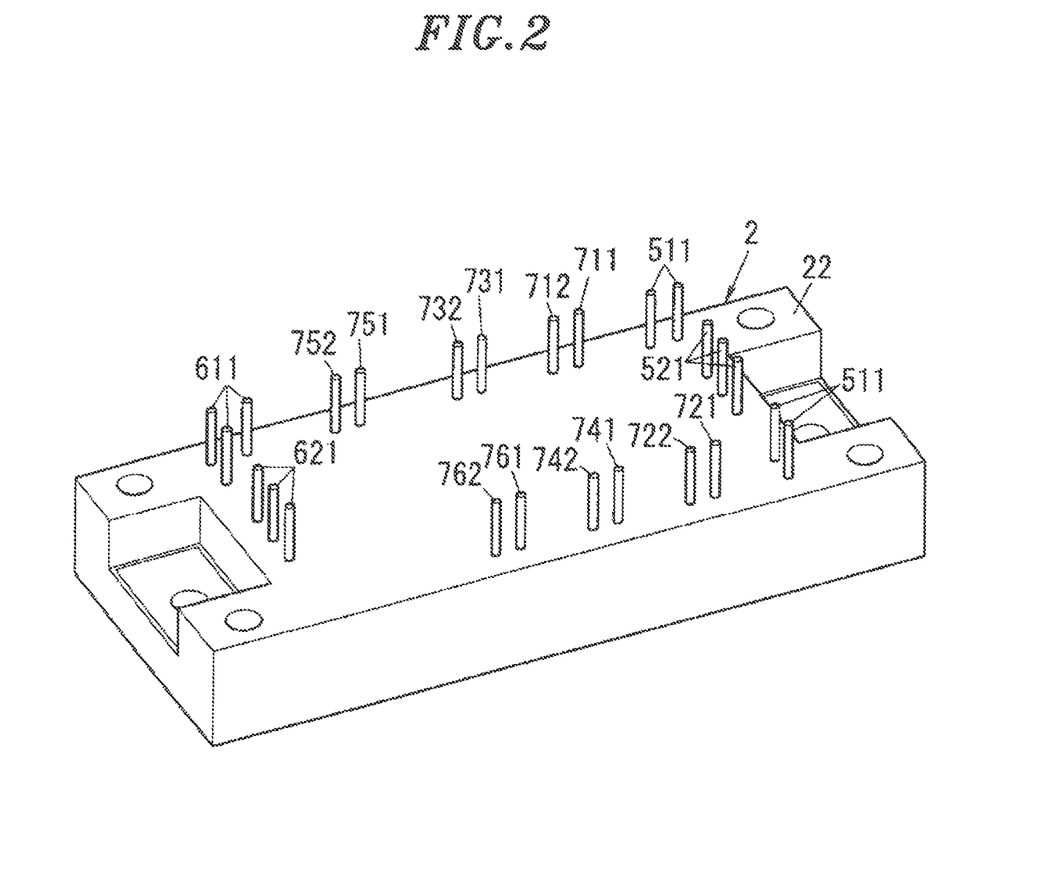
FIG. 2 is a schematic perspective view showing the circuit module according to the embodiment.
Figure 3:
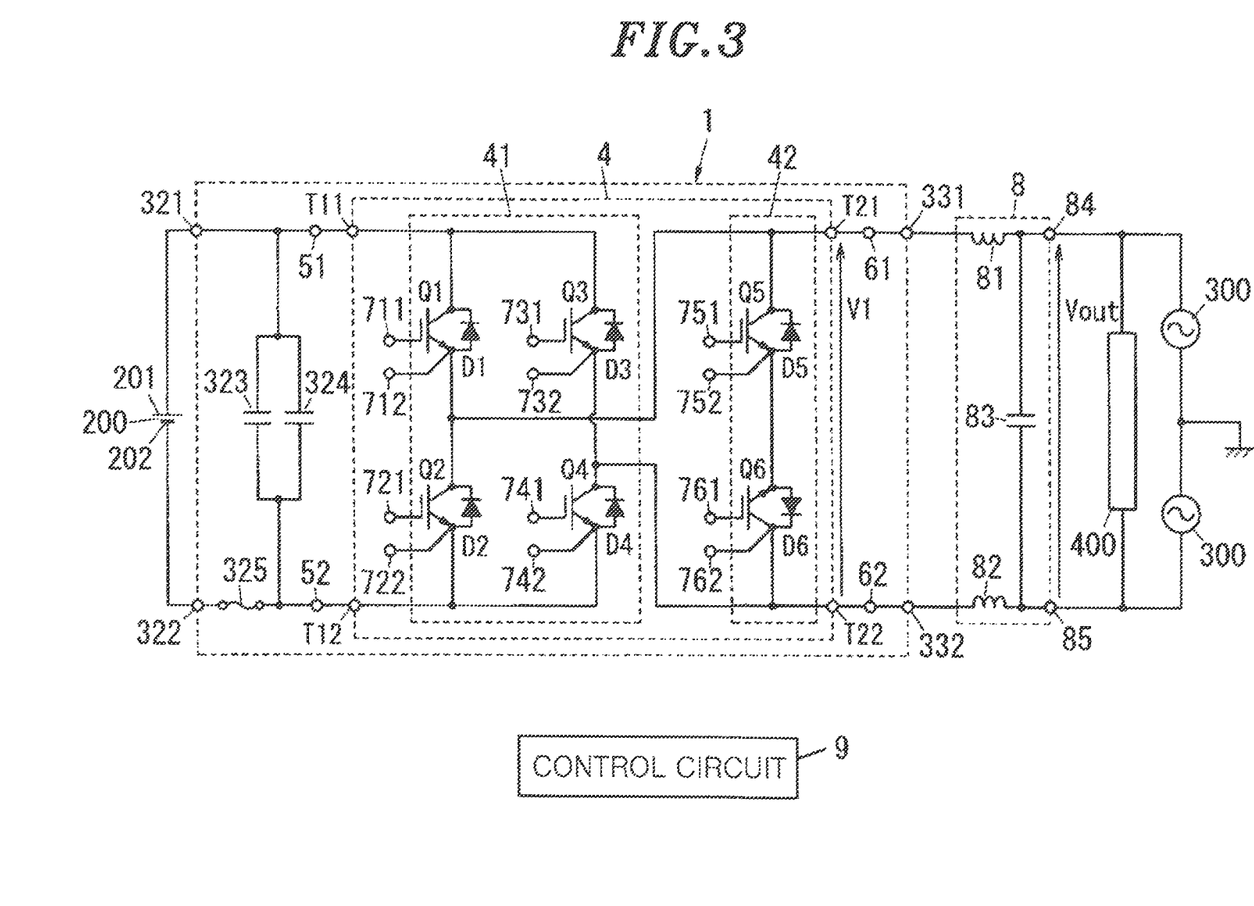
FIG. 3 is a schematic circuit diagram showing an inverter device according to an embodiment.

The package 22 is formed by, for example, molding a resin such as an epoxy resin or the like to cover the support body 21, the circuit part 4, the input terminal part 5, the output terminal part 6 and the drive terminal part 7 (see FIG. 2). Of course, the method of forming the package 22 is not limited to the molding but may be other forming methods.

The circuit part 4 is formed in a rectangular shape as shown in FIG. 1A. Of course, the shape of the circuit part 4 is not limited to the rectangular shape. The circuit part 4 may be formed, for example, in a circular shape, a trapezoidal shape, a triangular shape or the like. As shown in FIG. 3, the circuit pert 4 includes a pair of input points T11 and T12 (a first input point T11 and a second input point T12) and a pair of output points T21 and T22 (a first output point T21 and a second output Point T22), a conversion circuit 41, and a switch circuit 42.

The first input point T11 and the second input point T12 may be terminals, or may be parts of conductors formed as wirings on the support body 21. Likewise, the first output point T21 and the second output point T22 may be terminals, or may be parts of conductors formed as wirings on the support body 21.

The conversion circuit 41 is a full bridge type circuit including four switching elements Q1 to Q4. By switching on or off the switching elements Q1 to Q4, the conversion circuit 41 converts a DC voltage inputted through the pair of input points T11 and T12 into an AC voltage and outputs the AC voltage to between the output points T21 and T22. Each of the switching elements Q1 to Q4 is an IGBT (Insulated Gate Bipolar Transistor). The switching elements Q1 to Q4 may be composed of other semi conductor switching elements such as bipolar transistors, MOSFETs (Metal-Oxide-Semiconductor Field-Effect Transistors) or the like.

Diodes D1 to D4 are electrically connected between the collectors and the emitters of the switching elements Q1 to Q4, respectively. The diodes D1 to D4 are free-wheeling diodes.

In the conversion circuit 41, a series circuit of the switching elements Q1 and Q2 and a series circuit of the switching elements Q3 and Q4 are electrically connected in parallel. The collectors of the switching elements Q1 and Q3 are electrically connected to the first input point T11. The emitters of the switching elements Q2 and Q4 are electrically connected to the second input point T12. The connection point of the emitter of the switching element Q1 and the collector of the switching element Q2 and the connection point of the emitter of the switching element Q3 and the collector of the switching element Q4 become a pair of output ends of the conversion circuit 41.

The switch circuit 42 is provided between the conversion circuit 41 and the pair of output points T21 and T22 and is composed of a series circuit of two switching elements Q5 and Q6. The switching elements Q5 and Q6 are IGBTs, respectively. The switching elements Q5 and Q6 may be composed of other semiconductor switching elements such as bipolar transistors, MOSFETs or the like.

In the switch circuit 42, the collector of the switching element Q5 is electrically connected to the first output point T21. The collector of the switching element Q6 is electrically connected to the second output point T22. The emitter of the switching element Q5 and the emitter of the switching element Q6 are electrically connected to each other.

The switch circuit 42 is configured to switch between four states. The four states refer to a state of conducting in a first direction, a state of conducting in a second direction opposite to the first, direction, a state of conducting in both the first direction and the second direction, and a state of not conducting in any of the first direction and the second direction.

The switch circuit 42 may have another configuration. For example, the switch circuit 42 may have a configuration in which the emitter of the switching element Q5 is electrically connected to the first output point T21, the emitter of the switching element Q6 is electrically connected to the second output point T22, and the collector of the switching element Q5 is electrically connected to the collector of the switching element Q6. Further, the switch circuit 42 is not limited to the series circuit of the switching elements Q5 and Q6. For example, the switch circuit 42 may be formed of a double gate semiconductor element having two gate terminals.

Diodes D5 and D6 are electrically connected between the collectors and the emitters of the switching elements Q5 and Q6, respectively. Diodes D5 and D6 are free-wheeling diodes.

As shown in FIG. 1A, the input terminal part 5 includes two first input terminals 51 and one second input terminal 52. One of the two first input terminals 51 is formed of two terminals 511 and is arranged in the vicinity of the upper left corner of the circuit part 4. In addition, the other of the two first input terminals 51 is formed of two terminals 511 and is disposed in the vicinity of the lower left corner of the circuit part 4. The second input terminal 52 is formed of three terminals 521. In addition, the second input terminal 52 is arranged between the two first input terminals 51.

As shown in FIG. 3, the input terminal part 5 is electrically connected to a pair of input points T11 and T12 of the circuit part 4. Specifically, the first input terminal 51 of the input terminal part 5 is electrically connected to the first input point T11. In addition, the first input terminal 51 is electrically connected to a positive electrode 201 of a DC power supply 200. The second input terminal 52 of the input terminal part 5 is electrically connected to the second input point T12. The second input terminal 52 is also electrically connected to a negative electrode 202 of the DC power supply 200.

As shown in FIG. 1A, the output terminal part 6 includes a first output terminal 61 and a second output terminal 62. The first output terminal 61 includes three terminals 611 and is arranged in the vicinity of the upper right corner of the circuit part 4. The second output terminal 62 includes three terminals 621 and is arranged in the vicinity of the right end of the circuit part 4. In addition, the first output terminal 61 and the second output terminal 62 are arranged on the same side (right side in this case) with respect to the circuit part 4 around the circuit part 4. The first output terminal 61 and the second output terminal 62 may be arranged at positions adjacent to each other around the circuit part 4. For example, the first output terminal 61 and the second output terminal 62 may be disposed adjacent to each other to surround the upper right corner or the circuit part 4.

As shown in FIG. 3, the output terminal part 6 is electrically connected to a pair of output points T21 and T22 of the circuit part 4. Specifically, the first output terminal 61 of the output terminal part 6 is electrically connected to the first output point T21. The second output terminal 62 of the output terminal part 6 is electrically connected to the second output point T22.

As shown in FIG. 1A, the drive terminal part 7 includes six drive terminals 71, 72, . . . , 76. The drive terminals 71, 72, . . . , 76 include first terminals 711, 721, . . . , 761 and second terminals 712, 722, . . . , 762, respectively. In the following description, the drive terminals 71, 72, . . . , 76 will be referred to as "drive terminals 71 to 76". In the following description, the first terminals 711, 721, . . . , 761 will be referred to as "first terminals 711 to 761". In the following description, the second terminals 712, 722, . . . , 762 will be referred to as "second terminals 712 to 762".

As shown in FIG. 3, the first terminals 711 to 761 are electrically connected to the gates of the switching elements Q1 to Q6, respectively. The second terminals 712 to 762 are electrically connected to the emitters of the switching elements Q1 to Q6, respectively. The three drive terminals 71, 73 and 75 are arranged in the vicinity of the upper end of the circuit part 4. Further, the three drive terminals 72, 74 and 76 are arranged in the vicinity of the lower end of the circuit part 4.

As shown, in FIG. 2, in the circuit module 2 of this embodiment, the terminals 511, 521, 611 and 621, the first terminals 711 to 761, and the second terminals 712 to 762 are all formed of pin terminals protruding rearward along the thickness direction of the support body 21 (front-rear direction). Hereinafter, when collectively expressing the terminals 511, 521, 611 and 621, the first terminals 711 to 761, and the second terminals 712 to 762, they will be simply referred to as "terminal groups". As shown in FIGS. 1B and 2, each terminal group of the circuit module 2 penetrates the package 22 and protrudes to the outside. FIG. 1B is a schematic rear view of the package 22 and the terminal groups of the circuit module 2 protruding to the outside through the package 22 as viewed from the rear side.

<Structure of Inverter Device>

Next, the inverter device 1 of the present embodiment will be described. As shown in FIG. 4, the inverter device 1 of the present embodiment includes the circuit module 2 of the present embodiment and the substrate 3.

The substrate 3 is formed in a rectangular shape elongated in the left-right direction. Of course, the shape of the substrate 3 is not limited to the rectangular shape but may be other shapes. The substrate 3 includes a mounting portion 31, an input circuit 32, an out-put circuit 33, six drive circuits 341 to 346, and four drive power sources 351 to 354. Conductors 361 to 366 for electrically connecting the circuit module 2 to the input circuit 32 and the output circuit 33 are formed on the front surface of the substrate 3. Conductors (not shown) are also formed between the circuit module 2 and the drive circuits 341 to 346 and between the drive circuits 341 to 346 and the drive power sources 351 to 354.

The mounting portion 31 is provided at a position slightly shifted to the right from the center on the front surface of the substrate 3. Of course, the position of the mounting portion 31 is not limited thereto but may be other positions. The circuit module 2 is mounted on the mounting portion 31. More specifically, the mounting portion 31 has a plurality of (25 in this case) terminal holes 311. Each terminal hole 311 penetrates the substrate 3 in the thickness direction (front-rear direction) of the substrate 3. These terminal holes 311 are provided to correspond to the terminal groups of the circuit module 2. Therefore, by inserting the terminal groups of the circuit module 2 into the corresponding terminal holes 311 and soldering them, the circuit module 2 is mounted on the mounting portion 31.

The input circuit 32 includes two first input terminals 321, one second input terminal 322, two snubber capacitors 323 and 324, and a fuse 325.

Each of the two first input terminals 321 is formed of a terminal block. One (upper one) of the two first input terminals 321 is electrically connected to the conductor 361 and the other (lower one) first input terminal 321 is electrically connected to the conductor 362. In addition, the second input terminal 322 is electrically connected to the conductor 363.

The conductors 361 to 363 are wirings formed on the front surface of the substrate 3, respectively. The conductor 361 is electrically connected to one (upper one) of the two first input terminals 51 in a state where the circuit module 2 is mounted on the mounting portion 31. The conductor 362 is electrically connected to the other (lower one) of the two first input terminals 51 in a state where the circuit module 2 is mounted on the mounting portion 31. Further, the conductor 363 is electrically connected to the second input terminal 52 in a state where the circuit module 2 is mounted on the mounting portion 31.

Therefore, in a state where the circuit module 2 is mounted on the mounting portion 31, the first input terminal 321 is electrically connected to the first input point T11 via the first input terminal 51 as shown in FIG. 3. Further, the second input terminal 322 is electrically connected to the second input point T12 via the second input terminal 52 as shown in FIG. 3.

The snubber capacitors 323 and 324 are formed of, for example, film capacitors. In the snubber capacitor 323, a first electrode of the snubber capacitor 323 is electrically connected to the conductor 361, and a second electrode of the snubber capacitor 323 is electrically connected to the conductor 363. Among the two electrodes of the snubber capacitor 324, the first electrode is electrically connected to the conductor 362, and the second electrode is electrically connected to the conductor 363. As a result, the snubber capacitors 323 and 324 are electrically connected in parallel between the positive electrode 201 and the negative electrode 202 of the DC power supply 200 as shown in FIG. 3. The snubber capacitors 323 and 324 have a function of removing a high frequency noise and a function of stabilising the input voltage inputted from the DC power supply 200 to the circuit part 4.

A first end of the fuse 325 is electrically connected to the conductor 363 and a second end thereof is electrically connected to the conductor 364. As a result, as shown in FIG. 3, the fuse 325 is electrically connected between the negative electrode 202 of the DC power supply 200 and the second input point T12. The fuse 325 is fused when an overcurrent flows and has a function of protecting a circuit.

The output circuit 33 includes a pair of output terminals 331 and 332 (a first output terminal 331 and a second output terminal 332). Each of the first output terminal 331 and the second output terminal 332 is formed of a terminal block. The first output terminal 331 is electrically connected to the conductor 365. The second output terminal 332 is electrically connected to the conductor 366.

The conductors 365 and 366 are wirings formed on the front surface of the substrate 3, respectively. The conductor 365 is electrically connected to the first output terminal 61 in a state where the circuit module 2 is mounted on the mounting portion 31. Further, the conductor 366 is electrically connected to the second output terminal 62 in a state where the circuit module 2 is mounted on the mounting portion 31.

Therefore, in a state where the circuit module 2 is mounted on the mounting portion 31, the first output terminal 331 is electrically connected to the first output point T21 via the first output terminal 61 as shown in FIG. 3. Further, the second output terminal 332 is electrically connected to the second output point T22 via the second output terminal 62 as shown in FIG. 3.

Each of the drive circuits 341 to 346 is a driver that gives a drive signal to the switching elements Q1 to Q6 when receiving a control signal from the control circuit 9. The drive circuit 341 is electrically connected to the first terminal 711 and the second terminal 712 of the drive terminal 71 in a state where the circuit module 2 is mounted on the mounting portion 31. Similarly, the drive circuits 342 to 346 are electrically connected to the first terminals 721 to 761 and the second terminals 722 to 762 of the drive terminals 72 to 76, respectively, in a state where the circuit module 2 is mounted on the mounting portion 31. The drive circuits 341 to 346 and the drive terminals 71 to 76 are electrically connected by the conductors formed on the front surface of the substrate 3.

The drive circuits 341, 343 and 345 are disposed near the upper end of the mounting portion 31 (circuit module 2). Further, the drive circuits 342, 344 and 346 are disposed near the lower end of the mounting portion 31 (circuit module 2). In other words, the drive circuits 341 to 346 are disposed to be positioned between the input circuit 32 and the output circuit 33 around the mounting portion 31 (circuit module 2).

The drive power sources 351 to 354 are respectively disposed at the four corners on the front surface of the substrate 3. Specifically, the drive power source 351 is disposed in the upper left corner of the front surface of the substrate 3, and the drive power source 352 is disposed in the lower left corner of the front surface of the substrate 3. The drive power scarce 353 is disposed in the upper right corner of the front surface of the substrate 3, and the drive power source 354 is disposed in the lower right corner of the front surface of the substrate 3. Of course, the arrangement of the drive power sources 351 to 354 is not limited thereto, and the drive power sources 351 to 354 may be arranged in other arrangements. In order to sufficiently secure an electrical insulation distance, it is preferable that the drive power sources 351 to 354 are arranged in a spaced-apart relationship as far as possible.

The drive power sources 351 to 354 are power sources that supply drive voltages required to drive the switching elements Q1 to Q6 to the drive circuits 341 to 346. Specifically, the driving power source 351 supplies the drive circuit 341 with a drive voltage having the emitter potential of the switching element Q1 as a reference potential. The drive power source 352 supplies the drive circuit 343 with a drive voltage having the emitter potential of the switching element Q3 as a reference potential. Further, the drive power source 353 supplies the drive circuits 342 and 344 with drive voltages having the emitter potential of the switching element Q2 and the emitter potential of the switching element Q4 as reference potentials. The drive power source 354 supplies the drive circuits 345 and 346 with drive voltages having the emitter potential of the switching element Q5 and the emitter potential of the switching element Q6 as reference potentials. The drive power sources 351 to 354 and the drive circuits 341 to 346 are electrically connected by the conductors formed on the front surface of the substrate 3.

As shown in FIG. 3, for example, the inverter device 1 of the present embodiment is used together with the DC power supply 200, the filter 8 and the control circuit 9. The DC power supply 200 is electrically connected to the first input point T11 as the positive electrode 201 thereof is electrically connected to the first input terminal 321. In addition, the DC power supply 200 is electrically connected to the second input point T12 as the negative electrode 202 thereof is electrically connected to the second input terminal 322. The DC power supply 200 applies a DC voltage to between the first input point T11 and the second input point T12.

The filter a is a low-pass filter and includes two reactors 81 and 82 and a capacitor 83. A first end of both ends of the reactor 81 is electrically connected to a first electrode of both electrodes of the capacitor 83. In addition, the reactor 81 is electrically connected to the first output point T21 as a second end of both ends of the reactor 81 is electrically connected to the first output terminal 331 through an electric wire 37 (see FIG. 4). A first end of both ends of the reactor 82 is electrically connected to a second electrode of both electrodes of the capacitor 83. Further, the reactor 82 is electrically connected to the second output terminal T22 as a second end of both ends of the reactor 82 is electrically connected to the second output terminal 332 through an electric wire 38 (see FIG. 4).

A system power supply (commercial power system) 300 is electrically connected to a pair of output ends 84 and 85 (a first output end 84 and a second output end 85) of the reactor 31. Furthermore, a load 400 operating upon reception of supply of AC power is electrically connected to the first output end 84 and the second output end 85.

Specifically, the first output end 84 and the second output end 85 are electrically connected to an interconnection breaker provided in a distribution board, whereby the first, output end 84 and the second output end 85 are connected to the system power supply 300 and the load 400. That is, the inverter device 1 of the present embodiment converts DC power inputted from the DC power supply 200 into AC power, and outputs the AC power from the pair of output ends 84 and 85 of the filter 8 to the system power supply 300 and the load 400. In FIG. 3, the system power supply 300 is a single-phase three-wire type. However, the system power supply 300 is not limited to this example and may be a single-phase two-wire type. Further, the filter 8 may be incorporated in the inverter device 1 of the present embodiment or may be an external circuit.

The control circuit 9 mainly includes, for example, a microcomputer, and executes various processes by executing a program stored in a memory. The program may be provided through an electric communication line or may be provided by being recorded in a recording medium.

The control, circuit 9 gives control signals to the drive circuits 341 to 344, respectively, thereby applying drive signals no the switching elements Q1 to Q4 of the conversion circuit 41. Each drive signal is a PWM (Pulse Width Modulation) signal. The drive signal is not limited to the PWM signal but may be, for example, a PFM (Pulse Frequency Modulation) signal or a PAM (Pulse Amplitude Modulation) signal. In addition, the control circuit 9 gives control signals to the drive circuits 345 and 346, respectively, thereby applying drive signals to the switching elements Q5 and Q6 of the switch circuit 42. The control circuit 9 may be incorporated in the inverter device 1 of the present embodiment or may be an external circuit.

<Operation>

Hereinafter, the operation of the inverter device 1 of the present embodiment will be described. In the following description, the voltage applied to between the first output point T21 and the second output point T22 of the circuit part 4 will be referred to as "intermediate voltages V1". Further, in the following description, the voltage applied to between the first output end 84 and the second output end 85 of the filter 8 will be referred to as "output voltage Vout". Moreover, in the following description, it is assumed that the potential of the negative electrode 202 of the DC power supply 200 is 0 [V] and the power supply voltage of the DC power supply 200 is 'E1' [V].

The control circuit 9 alternately executes a first control of sequentially repeating a first period to a fourth period shown in the following Table 1 and a second control of sequentially repeating a fifth period to as eighth period shown in the following Table 2, thereby controlling the conversion circuit 41 and the switch circuit 42. Tables 1 and 2 show the states of the switching elements Q1 to Q6 in each period, and the intermediate voltage V1.

TABLE 1

|  | Q1, Q4 | Q2, Q3 | Q5 | Q6 | V1 |
| --- | --- | --- | --- | --- | --- |
| First period | ON | OFF | OFF | ON | E1 |
| Second period | OFF | OFF | OFF | ON | 0 |
| Third period | OFF | OFF | ON | ON | 0 |
| Fourth period | OFF | OFF | OFF | ON | 0 |

TABLE 2

|  | Q1, Q4 | Q2, Q3 | Q5 | Q6 | V1 |
| --- | --- | --- | --- | --- | --- |
| Fifth period | OFF | ON | ON | OFF | −E1 |
| Sixth period | OFF | OFF | ON | OFF | 0 |
| Seventh period | OFF | OFF | ON | ON | 0 |
| Eighth period | OFF | OFF | ON | OFF | 0 |

In the first control, the control circuit 9 sets the combination of the first period, the second period, the third period and the fourth period as one cycle, and changes the duty ratio of the drive signal which is given to the switching elements Q1, Q4 and Q5 every cycle. In the first control, the switching elements Q2 and Q3 of the conversion circuit 41 are always turned off. In the first control, the switching element Q5 of the switch circuit 42 is always turned on. In addition, the second period is a period through which the first period is shifted to the third period, and the fourth period is a period through which the third period is shifted to the first period. The second period and the fourth period are shorter than the first period and the third period.

In the second control, the control circuit 9 sets the combination of the fifth period, the sixth period, the seventh period and the eighth period as one cycle, and changes the duty ratio of the drive signal which is given to the switching elements Q2, Q3 and Q6 every cycle. In the second control, the switching elements Q1 and Q4 of the conversion circuit 41 are always turned off. In the second control, the switching element Q5 of the switch circuit 42 is always turned off. The sixth period is a period through which the fifth period is shifted to the seventh period, and the eighth period is a period through which the seventh period is shifted to the fifth period. The sixth period and the eighth period are shorter than the fifth period and the seventh period.

Figure 5:
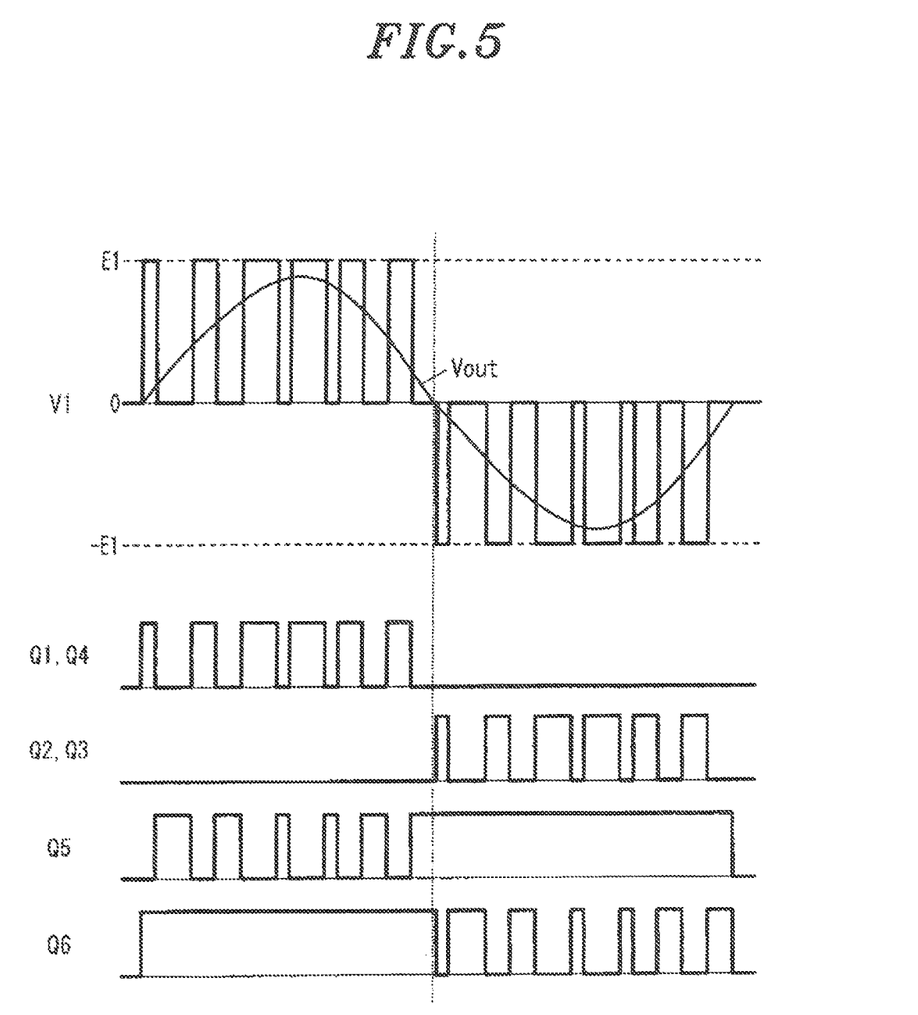
FIG. 5 is a diagram showing operation waveforms of the inverter device according to the embodiment.

When the control circuit 5 executes the first control, as shown in FIG. 5, the intermediate voltage V1 becomes an AC voltage of rectangular waveform having a minimum voltage value of 0 [V], a maximum voltage value of E1 [v]

and an amplitude of E1 [V], When the control circuit 9 executes the second control, as shown in FIG. 5, the intermediate voltage V1 becomes an AC voltage of rectangular waveform having a minimum voltage value of −E1 [V], a maximum voltage value of 0 [V] and an amplitude of E1 [V]. As the control circuit 9 alternately and repeatedly executes the first control and the second control, the output voltage Vout becomes an AC voltage of sinusoidal waveform as shown in FIG. 5. Further, FIG. 5 shows the on/off timing of the switching elements Q1 to Q6, the waveform of the intermediate voltage V1, and the waveform or the output voltage Vout.

The inverter device 1 using the circuit module 2 of the present embodiment can suppress the fluctuation of the potential of the negative electrode 202 of the DC power supply 200 as compared with an inverter device using a circuit module which does not have the switch circuit 42. In the inverter device 1 using the circuit module 2 according to the present embodiment, the amplitude of the output voltage (that is, the intermediate voltage V1) of the conversion circuit 41 can be halved while suppressing the fluctuation of the potential of the negative electrode 202 of the DC power supply 200. In other words, the circuit module 2 of the present embodiment can reduce a noise compared to a circuit module that does not use the switch circuit 42.

COMPARATIVE EXAMPLE

Figure 6:
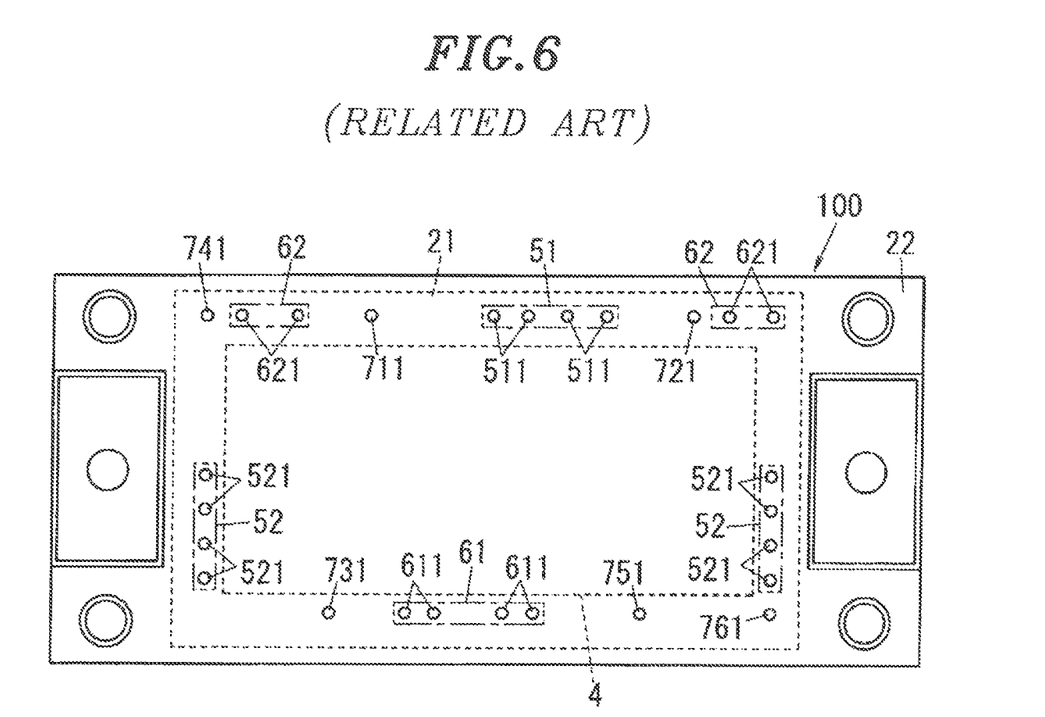
FIG. 6 is a schematic front view showing a circuit module of a comparative example.

As a comparative example of the circuit module 2 of the present embodiment, a circuit module 100 obtained by modifying an existing circuit module for a three-phase inverter will now be described. In the circuit module 100 of the comparative example, as shown in FIG. 6, the arrangement of terminal groups is different from that of the circuit module 2 of the present embodiment. Specifically, the terminals 511 of the first input terminal 51 are arranged in the vicinity of the central portion in the left-right direction at the upper end of the support body 21. The terminals 521 of the second input terminal 52 are separately arranged at two positions, namely a position near the left end of the support body 21 and a position near the right end of the support body 21. In addition, the terminals 611 of the first output terminal 61 are arranged in the vicinity of the center portion in the left-right direction at the lower end of the support body 21. The terminals 621 of the second output terminal 62 are arranged at two positions, namely a position near the upper left end of the support body 21 and a position near the upper right end of the support body 21. The first terminals 711 to 761 and the second terminals 712 to 762 of the drive terminals 71 to 76 are arranged within a range different from the range in which the terminals 511, 521, 611 and 621 are arranged. In FIG. 6, illustration of the second terminals 712 to 762 is omitted.

That is, in the circuit module 100 of the comparative example, the first input terminal 51 and the two second input terminals 52 of the input terminal part 5 are disposed in a spaced-apart relationship with each other to interpose the circuit part 4 therebetween. Therefore, when the inverter device 1 is formed by mounting the circuit module 100 of the comparative example on the substrate 3, it is difficult to lay out the wiring between the DC power supply 200 (or the input circuit 32) and the input terminal part 5. Specifically, the wiring has to be laid out between the first input terminal 321 of the input circuit 32 and the first input terminal 51 and between the second input terminal 322 and the second input terminal 52 while avoiding the circuit part 4. This mates if difficult to lay out the wiring.

Further, in the circuit module 100 of the comparative example, the two second input, terminals 52 are arranged separately in the left and right end portions of the support body 21. Therefore, when the circuit module 100 of the comparative example is mounted on the substrate 3 to form the inverter device 1, there is also a problem that it is difficult arrange the snubber capacitors 323 and 324 between the first input terminal 51 and the two second, input terminals 52.

Further, in the circuit module 100 of the comparative example, the first output terminal 61 and the second output terminal 62 of the output terminal part 6 are disposed in a spaced-apart relationship with each other to interpose the circuit part 4 therebetween. Therefore, when the inverter module 1 is formed by mounting the circuit module 100 of the comparative example on the substrate 3, there is a problem that it is difficult to lay out the wiring between the output terminal part 6 and the filter 8, and the wiring becomes longer. Specifically, the wiring between the first output terminal 61 and the reactor 81 and the wiring between the second output terminal 62 and the reactor 82 has to be laid out while avoiding the circuit part 4. This makes it difficult lay out the wirings. Moreover, the wirings become longer.

An AC voltage of rectangular waveform having an amplitude corresponding to the power supply voltage of the DC power supply 200 is applied to between the first output terminal 61 and the second output terminal 62. Therefore, the wiring between the output terminal part 6 and the filter 8 is likely to become a noise source that generates a large noise. In the circuit module 100 of the comparative example, there is a problem that a noise is likely to occur because the wiring between the output terminal part 6 and the filter 8 becomes longer. Further, in the circuit module 100 of the comparative example, there is also a problem that a noise is more likely to be emitted because the two second output terminals 62 are separated to interpose the circuit part 4 therebetween. Furthermore, the wiring between the first output terminal 61 and the reactor 81 and the wiring between the second output terminal 62 and the reactor 82 cannot be formed of twisted pair cables. Therefore, in the circuit module 100 of the comparative example, there is a problem that it is impossible to effectively reduce the noise caused by the wiring between the output terminal part 6 and the filter 8.

In order to avoid the influence of a large noise that may be generated from the wiring electrically connected to the terminals 511, 521, 611 and 621, it is preferred that the drive circuits 341 to 346 are disposed in a spaced-apart relationship with the terminals 511, 521, 611 and 621. However, in the circuit, module 100 of the comparative example, the terminals 511, 521, 611 and 621, to which a high voltage is applied, and the first terminals 711 to 761 and the second terminals 712 to 762, to which a low voltage is applied, are arranged in a confused manner. The high voltage is, for example, several hundred volts. The low voltage is, for example, several tens volts.

Accordingly, when the circuit module 100 of the comparative example is mounted on the substrate 3 to form the inverter device 1, it is difficult to arrange the drive circuits 341 to 346 in a spaced-apart relationship with the terminals 511, 521, 611 and 621 to which the high voltage is applied. In this case, in order to arrange the drive circuits 341 to 346 in a spaced-apart relationship with the terminals 511, 521, 611 and 621, it is inevitable to increase the size of the substrate 3 and, ultimately, to increase the sire of the inverter device 1.

<Effect>

Hereinafter, the effects achieved by using the circuit module 2 of the present embodiment will be described in comparison with the circuit module 100 of the comparative example. In the circuit module 2 of the present embodiment, as shown in FIGS. 1A and 1B, the first output terminal 61 and the second output terminal 62 are arranged adjacent to each other on the right side of the circuit part 4. In other words, on one surface (front surface) of the support body 21, the arrangement of the output terminal part 6 is at least one of the following two arrangements. That is, the arrangement of the output terminal part 6 is at least one of an arrangement in which the first output terminal 61 and the second output terminal 62 are positioned on the same side with respect to the circuit part 4 around the circuit part 4 and an arrangement in which the first output terminal 61 and the second output terminal 62 are adjacent to each other around the circuit part 4.

In this regard, the same side with respect to the circuit part 4 refers to, for example, one of the opposite sides with respect to a reference line when the circuit part 4 is bisected by the reference line. In the example shown in FIG. 1A, the first output terminal 61 and the second output terminal 62 are arranged on the right side in FIG. 1A with respect to the circuit part 4. Further, for example, in the case where the circuit part 4 is formed in a trapezoidal shape, the same side with respect to the circuit part 4 refers to one of the sides surrounding a reference line passing through the gravity center of the circuit part 4.

In this configuration, as compared with the circuit module 100 of the comparative example, for example, the first output terminal 61 and the second output terminal 62 are not separated from each other to interpose the circuit part 4 therebetween. It is therefore possible to narrow the distance between the first output terminal 61 and the second output terminal 62. Accordingly, when, the inverter device 1 is formed by mounting the circuit module 2 of the present embodiment on the substrate 3, it is possible to reduce the lengths of the wirings (conductors 365 and 366) electrically connected to the output terminal part 6. This makes it possible to reduce the noise radiated from the wirings.

Furthermore, in this configuration, since the lengths of the wirings (conductors 365 and 366) can be shortened, it is possible to increase the distance between, the wirings and other wirings on the substrate 3 or between the wirings and the low voltage circuits (for example, the drive circuits 341 to 346) on the substrate 3. Therefore, in this configuration, it is possible to reduce the influence of the noise radiated from the wirings (conductors 365 and 366) on other wirings and the low voltage circuits. Moreover, since the second output terminal 62 is not separated across the circuit part 4 unlike the circuit module 100 of the comparative example, a noise is hardly radiated from the wirings (conductors 365 and 366).

Furthermore, in this configuration, the wiring (electric wire 37) between the first output terminal 61 and the reactor 81 and the wiring (electric wire 38) between the second output terminal 62 and the reactor 82 can be formed of twisted pair cables. Therefore, if a pair of wirings (electric wires 37 and 38) is formed of twisted pair cables, it is possible to effectively reduce the noise caused by the wirings between the output terminal part 6 and the filter 8.

As already described, the circuit module 2 of the present embodiment may also achieve an effect of reducing a noise by using the switch circuit 42. That, is, in the circuit module 2 of the present embodiment, it is possible to further reduce the noise by the synergistic effect offered by the effect of reducing the noise using the switch circuit 42 and the effect of reducing the noise using the arrangement of the output terminal part 6. The noise referred to herein is, for example, a conduction noise or a radiation noise.

Meanwhile, in the circuit module 2 of the present embodiment, the arrangement of the input terminal part 5 is also the same as that of the output terminal part 6. That is, on one surface (front surface) of the support body 21, the arrangement of the input terminal part 5 is at least one of the following two arrangements. That is, the arrangement of the input terminal part 5 is at least one of an arrangement in which the first input terminal 51 and the second input terminal 52 are arranged on the same side with respect to the circuit part 4 around the circuit part 4 and an arrangement in which the first input terminal 51 and the second input terminal 52 are adjacent to each other around the circuit part 4. Therefore, for example, the first input terminal 51 and the second input terminal 52 are not separated from each other with the circuit part 4 interposed therebetween. This makes it possible to narrow the distance between the first input terminal 51 and the second input terminal 52. Accordingly, when the circuit module 2 having this structure is mounted on the substrate 3 to form the inverter device 1, it is easy to arrange the snubber capacitors 321 and 324 of the input circuit 32 on the substrate 3. In addition, in this configuration, the lengths of the wirings (conductors 361 to 364) electrically connected to the input terminal part 5 can be shortened. It is therefore possible to reduce the noise radiated from the wirings.

Furthermore, in this configuration, since the lengths of the wirings (conductors 361 to 364) can be shortened, it is possible to increase the distance between the wirings and other wirings on the substrate 3 or between the wirings and the low voltage circuits (for example, the drive circuits 341 to 346). Therefore, in this configuration, it is possible to reduce the influence of the noise radiated from the wirings (conductors 365 and 366) on other wirings and the low voltage circuits. In addition, since the two first input terminals 51 are not separated across the circuit part 4 unlike the circuit module 100 of the comparative example, a noise is hardly radiated from the wirings (conductors 361 and 362). It is arbitrary to determine whether or not to arrange the first input terminal 51 and the second input terminal 52 as described above.

Figure 7A:
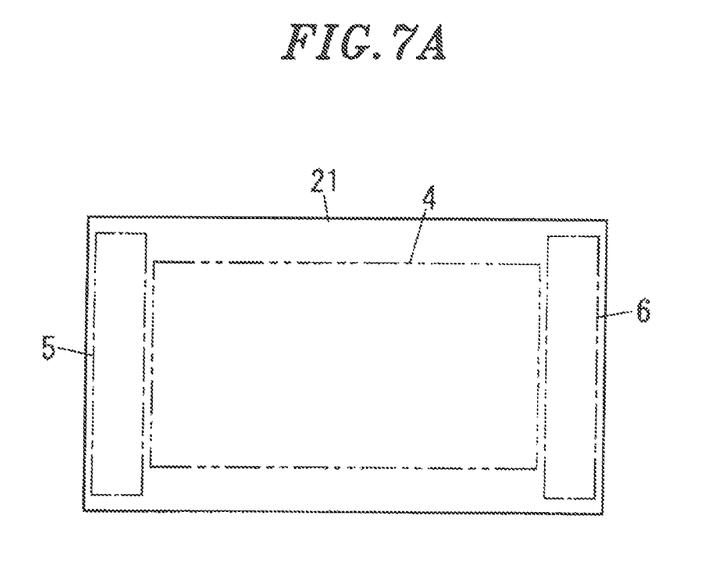
FIGS. 7A and 7B are schematic plan views respectively showing examples of the arrangement of an input terminal part and an output, terminal part in the circuit module according to the embodiment.

Further, in the circuit module 2 of the present embodiment, the input terminal part 5 and the output terminal part 6 are preferably arranged as shown in FIGS. 1A and 7A. Specifically, the input terminal part 5 is preferably disposed in the vicinity of one end (left end) in the longitudinal direction of the circuit part 4, and the output terminal part 6 is preferably disposed in the vicinity of the other end (right end) in the longitudinal direction of the circuit part 4.

That is, in the circuit module 2 of the present embodiment, it is preferable that the circuit part 4 is disposed between the input terminal part 5 and the output terminal part 6 on one surface (front surface) of the support body 21. With this configuration, by arranging the input terminal part 5 and the output terminal part 6 at the opposite sides with respect to the circuit part 4, it is possible to increase the electrical insulation distance between the input, terminal part 5 and the output terminal part 6. That is, in this configuration, it is possible to sufficiently secure the electrical insulation distance between the input terminal part 5 and the output terminal part 6 while reducing the size of the substrate 3.

Figure 7B:
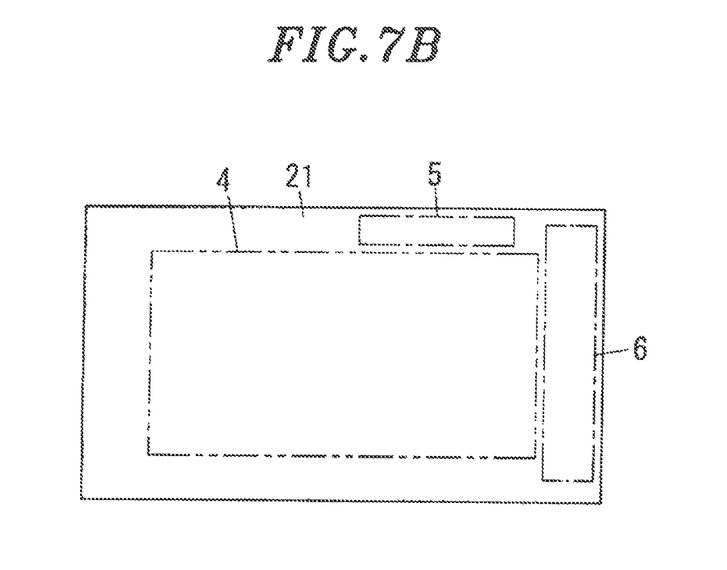

Of course, it is arbitrary to determine whether or not to arrange the input terminal part 5 and the output terminal part 6 as described above. For example, the input terminal part 5 and the output terminal part 6 may be disposed on the opposite sides with respect to the circuit part 4 in the up-down direction. Moreover, for example, as shown in FIG. 7B, the input terminal part 5 and the output terminal part 6 may be disposed on two sides surrounding the upper right corner of the circuit part 4.

Meanwhile, one snubber capacitor may be electrically connected between the positive electrode 201 and the negative electrode 202 of the DC power supply 200. However, in this configuration, it is necessary to prepare a snubber capacitor having a large capacity corresponding to the power supply voltage of the DC power supply 200. The snubber capacitor becomes larger in size as the capacity thereof increases. Therefore, when the snubber capacitor corresponding to the power supply voltage of several hundred volts is disposed on the substrate 3, it is inevitable to increase the size of the substrate 3 and, ultimately to increase the size of the inverter device 1.

Figure 8A:
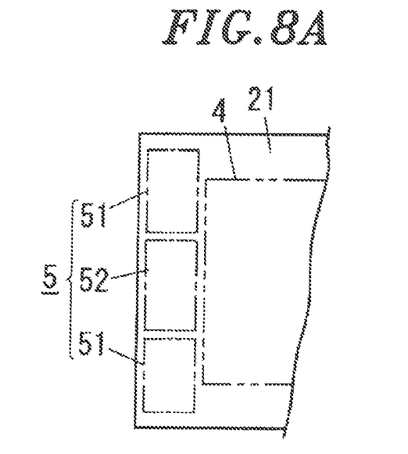
FIGS. 8A and 8B are schematic plan views respectively showing examples of the arrangement of a first input terminal and a second input terminal in the circuit module according to the embodiment.

Therefore, in the circuit module 2 of the present embodiment, as shown in FIGS. 1A and 8A, the input terminal part 5 preferably includes a plurality of (two, in this case) first input terminals 51 and one second input terminal 52. In this configuration, the snubber capacitors 323 and 324 can be electrically connected between one of the two first input terminals 51 and the second input terminal 52, and between the other first input terminal 51 and the second input terminal 52. That is, the parallel circuit of the two snubber capacitors 321 and 324 can be electrically connected between the positive electrode 201 and the negative electrode 202 of the DC power supply 200. Accordingly, by using two small-capacity snubber capacitors 323 and 324 instead of one large-capacity snubber capacitor, it is possible to avoid the increase in the size of the substrate 3 and, ultimately, to avoid the increase in the size of the inverter device 1.

Further, as shown in FIGS. 1A and 8A, on one surface (front surface) of the support body 21, one second input terminal 52 is preferably disposed between, a plurality of (two, in this case) first input terminals 51. In this configuration, it is easy to arrange the snubber capacitors 323 and 324 on the substrate 3. It is arbitrary to determine whether or not to form the input terminal part 5 as described above.

Figure 8B:
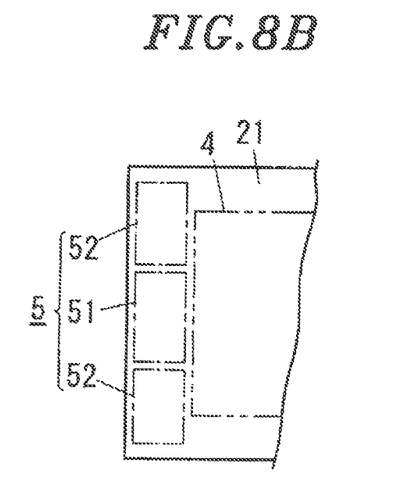

Moreover, for example, as shown in FIG. 8B, the input terminal part 5 may include one first input terminal 51 and a plurality of (two, in this case) second input terminals 52. In this configuration, the snubber capacitors 323 and 324 can be electrically connected between one of the two second input terminals 52 and the first input terminal 51, and between the other second input terminal 52 and the first input terminal 51. Accordingly, even in this configuration, as described above, it is possible to avoid the increase in the size of the substrate 3 and, ultimately to avoid the increase in the size of the inverter device 1.

Furthermore, as shown in FIG. 8B, on one surface (front surface) of the support body 21, one first input terminal 51 is preferably disposed between a plurality of (two, in this case) second input terminals 52. In this configuration, it is easy to arrange the snubber capacitors 323 and 324 on the substrate 3. It is arbitrary to determine whether or not to form the input terminal part 5 as described above.

Although the circuit module 2 of the present embodiment includes the drive terminals 71 to 76, it is preferable that the drive terminals 71 to 76 are arranged as shown in FIG. 1A. Specifically, it is preferable that the drive terminals 71, 73 and 75 are disposed near the upper end of the circuit part 4.

Further, it is preferable that the drive terminals 72, 74 and 76 are arranged in the vicinity of the lower one of the circuit part 4.

That is, in the circuit module 2 of the present embodiment, each of the conversion circuit 41 and the switch circuit 42 includes the switching elements Q1 to Q6. The circuit module of the present embodiment includes the drive terminals 71 to 76 to which the drive signal for driving the switching elements Q1 to Q6 of each of the conversion circuit 41 and the switch circuit 42 is inputted. On one surface (front surface) of the support body 21, the drive terminals 71 to 76 are preferably arranged between the input terminal part 5 and the output terminal part 6 around the circuit part 4.

In this configuration, as compared with the circuit module 100 of the comparative example, the terminals 511, 521, 611 and 621 to which a high voltage is applied and the drive terminals 71 to 76 to which a low voltage is applied are respectively partitioned and arranged. Therefore, they are not arranged in a confused manner. Accordingly, when the circuit module 2 having this configuration is mounted on the substrate 3 to form the inverter device 1, the drive circuits 341 to 346 can be easily arranged on the substrate 3 in a spaced-apart relationship with the terminals 511, 521, 611 and 621 to which she high voltage is applied. In this configuration, since the drive circuits 341 to 346 can be easily arranged in a spaced-apart relationship with the terminals 511, 521, 611 and 621, it is possible to avoid the increase in the size of the substrate 3 and, ultimately, to avoid the increase in the size of the inverter device 1. It is arbitrary to determine whether or not to arrange the drive terminals 71 to 76 as described above.

Although the inverter device 1 of the present embodiment includes the input circuit 32 and the output circuit 33, the input circuit 32 and the output circuit 33 are preferably arranged as shown in FIG. 4. Specifically, it is preferable that the input, circuit 32 is disposed in the vicinity of one end (left end) in the longitudinal direction of the circuit module 2 on the front surface of the substrate 3. Further, it is preferable that the output circuit 33 is disposed in the vicinity of one end (right end) in the longitudinal direction of the circuit module 2 on the front surface of the substrate 3.

That is, the inverter device 1 of the present embodiment farther includes the input circuit 32 provided on the substrate 3 and electrically connected to the input terminal part 5, and the output circuit 33 provided on the substrate 3 and electrically connected to the output terminal part 6. On one surface (front surface) of the substrate 3, the input circuit 32 is preferably arranged on the same side as the input terminal part 5 of opposite sides with respect of the circuit module 2. Further, on one surface (front surface) of the substrate 3, the output circuit 33 is preferably arranged on the same side as the output terminal part 6 of opposite sides with respect to the circuit module 2.

In this configuration, it is possible to narrow the distance between the input terminal part 5 and the input circuit 32. Further, in this configuration, it is possible to narrow the distance between the output terminal part 6 and the output circuit 33. That is, in this configuration, it is possible to easily lay out the wirings (conductors 361 to 364) between the input terminal part 5 and the input circuit 32 and the wirings (conductors 365 and 366) between the output terminal part 6 and the output circuit 33. Moreover, in this configuration, it is possible to shorten the wirings (conductors 361 to 364) between the input terminal part 5 and the input circuit 32 and the wirings (conductors 365 and 366)

between the output terminal part 6 and the output circuit 33. This makes it possible to further reduce a noise.

Although the input circuit 32 includes two first input terminals 321, one second input terminal 322, two snubber capacitors 323 and 324, and the fuse 325, the configuration of the input circuit 32 is not limited thereto but may be other configurations. Although the output circuit 33 includes the pair of output terminals 331 and 332 (the first output terminal 331 and the second output terminal 332), the configuration of the output circuit 33 is not limited thereto but may be other configurations. In the inverter device 1 of the present embodiment, it is arbitrary to determine whether or not to arrange the input circuit 32 and the output circuit 33 as described above.

Further, although the inverter device 1 of the present embodiment includes the drive circuits 341 to 346, it is preferable that the drive circuits 341 to 346 are arranged as shown in FIG. 4. Specifically, it is preferable that the drive circuits 341, 343 and 345 are arranged near the upper end of the circuit module 2 around the circuit module 2 on the front surface of the substrate 3. Further, it is preferable that the drive circuits 342, 344 and 346 are arranged near the lower end of the circuit module 2 around the circuit module 2 on the front surface of the substrate 3.

In other words, in the inverter device 1 of the present embodiment, each of the conversion circuit 41 and the switch circuit 42 includes the switching elements Q1 to Q6. The inverter device 1 of the present embodiment further includes the drive circuits 341 to 346 provided on the substrate 3 and configured to supply the drive signals for driving the switching elements Q1 to Q6 of each of the conversion circuit 41 and the switch circuit 42 to the circuit module 2. On one surface (front surface) of the substrate 3, the drive circuits 341 to 346 are preferably disposed between the input circuit 32 and the output circuit 33 around the circuit module 2.

In this configuration, the drive circuits 341 to 346 can be arranged by effectively utilizing the space, in which the input terminal part 5 and the output terminal part 6 are not arranged, in the area around the circuit module 2 on the front surface of the substrate 3.

Furthermore, in the circuit module 2 of the present embodiment, if the drive terminals 71 to 76 are disposed on both upper and lower sides of the circuit part 4 to interpose the circuit part 4 therebetween, it is possible to reduce the distance between the drive circuits 341 to 346 and the drive terminals 71 to 76. More specifically, as shown in FIG. 1A, the drive terminals 71, 73 and 75 may be disposed in the vicinity of the upper end of the circuit part 4, and the drive terminals 72, 74 and 76 may be disposed in the vicinity of the lower end of the circuit part 4. In other words, it is preferable that, on one surface (front surface) of the substrate 3, the drive circuits 341 to 346 are arranged on the same side as the drive terminals 71 to 76 around the circuit module 2.

In this case, it is possible to shorten the lengths of the wirings between the drive circuits 341 to 346 and the drive terminals 71 to 76. This makes it possible to reduce the noise and to reduce the possibility of erroneous operations of the drive circuits 341 to 346. Furthermore, in this configuration, the wirings (conductors 361 to 364) between the input terminal part 5, to which a high voltage is applied, and the input circuit 32 do not intersect the wirings between the drive circuits 341 to 346, to which a low voltage is applied, and the drive terminals 71 to 76. Similarly, in this configuration, the wirings (conductors 365 and 366) between the output terminal part 6, to which a high voltage is applied, and the output circuit 33 do not intersect the wirings between the drive circuits 341 to 346, to which a low voltage is applied, and the drive terminals 71 to 76. Accordingly, in this configuration, the wirings to which a high voltage is applied do not pass near the wirings to which a low voltage is applied. It is therefore possible to enhance the reliability of the operation of the drive circuits 341 to 346. In the inverter device 1 of the present embodiment, it is arbitrary to determine whether or not to arrange the drive circuits 341 to 346 as described above.

In the circuit module 2 of the present embodiment, each terminal group is formed of pin terminals. However, each terminal group may be formed of, for example, surface-mounted terminals such as lead terminals, electrodes or the like. In the case where each terminal group is formed of lead terminals or electrodes, it is preferable that a plurality of electrodes is provided on the mounting portion 31 of the substrate 3 instead of the terminal holes 311. Moreover, in this case, the circuit module 2 of the present embodiment can be surface-mounted on the substrate 3. Thus, the terminal holes 311 are not required. This makes it possible to downsize the substrate 3.

What is claimed is:

1. A circuit module, comprising:
   a circuit part;
   an input terminal part electrically connected to a pair of input points of the circuit part;
   an output terminal part electrically connected to a pair of output points of the circuit part; and
   a support body configured to support the circuit part, the input terminal part and the output terminal part,
   wherein the circuit part includes a conversion circuit for converting a DC voltage inputted between the input points into an AC voltage and outputting the AC voltage to between the output points, and a switch circuit electrically connected between the output points,
   wherein the output terminal part includes a first output terminal and a second output terminal which are electrically connected to the respective output points, and
   wherein on one surface of the support body, the output terminal part is arranged in at least one of an arrangement in which the first output terminal and the second output terminal are positioned on the same side with respect to the circuit part around the circuit part and an arrangement in which the first output terminal and the second output terminal are adjacent to each other around the circuit part,
   wherein the input terminal part includes two first input terminals electrically connected to a positive electrode of a DC power supply and a second input terminal electrically connected to a negative electrode of the DC power supply, and the second input terminal is mechanically located between the two first input terminals on the one surface of the support body, and
   wherein two snubber capacitors are electrically connected between one of the two first input terminals and the second input terminal and between the other first input terminal and the second input terminal.

2. The circuit module of claim 1, wherein on the one surface of the support body, the circuit part is disposed between the input terminal part and the output terminal part.

3. The circuit module of claim 1, wherein each of the conversion circuit and the switch circuit includes a switching element,
   wherein the circuit module further comprises a drive terminal to which a drive signal for driving the switching element of each of the conversion circuit and the switch circuit is inputted, and wherein on one surface of the support body, the drive terminal is disposed between the input terminal part and the output terminal part around the circuit part.

4. An inverter device, comprising:

the circuit module of claim 1; and a substrate on which the circuit module is mounted.

5. The inverter device of claim 4, further comprising:

an input circuit provided on the substrate and electrically connected to the input terminal part; and an output circuit provided on the substrate and electrically connected to the output terminal part, wherein on one surface of the substrate, the input circuit is disposed on the same side as the input terminal part with respect to the circuit module, and wherein on one surface of the substrate, the output circuit is disposed on the same side as the output terminal part with respect to the circuit module.

6. The inverter device of claim 5, wherein each of the conversion circuit and the switch circuit includes a switching element, wherein the inverter device further comprises a drive circuit provided on the substrate and configured to apply a drive signal for driving the switching element of each of the conversion circuit and the switch circuit to the circuit module, and wherein on one surface of the substrate, the drive circuit is disposed between the input circuit and the output circuit around the circuit module.

7. The circuit module of claim 1, wherein on the one surface of the support body, the input terminal part is arranged in at least one of an arrangement in which the first input terminal and the second input terminal are positioned on the same side with respect to the circuit part around the circuit part and an arrangement in which the first input terminal and the second input terminal are adjacent to each other around the circuit part.

\* \* \* \* \*